United States Patent [19]

Winnerl et al.

[11] Patent Number: 4,807,010
[45] Date of Patent: Feb. 21, 1989

[54] INTEGRATED CIRCUIT IN COMPLEMENTARY CIRCUIT TECHNOLOGY COMPRISING A SUBSTRATE BIAS VOLTAGE GENERATOR AND A SCHOTTKY DIODE

[75] Inventors: Josef Winnerl, Landshut; Dezsö Takacs, Munich, both of Fed. Rep. of Germany

[73] Assignee: Siemens Aktiengesellschaft, Berlin and Munich, Fed. Rep. of Germany

[21] Appl. No.: 895,313

[22] Filed: Aug. 11, 1986

[30] Foreign Application Priority Data

Aug. 26, 1985 [DE] Fed. Rep. of Germany ....... 3530428

[51] Int. Cl.$^4$ .................... H01L 29/48; H01L 29/78; H01L 27/02; H01L 23/48
[52] U.S. Cl. ........................ 357/42; 357/15; 357/23.1; 357/67
[58] Field of Search ................. 357/25, 23.1, 42, 675; 307/296.1

[56] References Cited

U.S. PATENT DOCUMENTS

| | | | |
|---|---|---|---|
| 4,233,672 | 11/1980 | Suzuki et al. | 357/42 |
| 4,255,677 | 3/1981 | Boonstra et al. | 357/42 |
| 4,300,152 | 11/1981 | Lepselter | 357/42 |
| 4,408,304 | 10/1983 | Nishizawa et al. | 357/42 |
| 4,513,309 | 4/1985 | Cricchi | 357/42 |

FOREIGN PATENT DOCUMENTS

| | | | |
|---|---|---|---|
| 58-223362 | 12/1983 | Japan | 357/42 |
| 2054955 | 2/1981 | United Kingdom | 357/42 |

OTHER PUBLICATIONS

F. Mohammadi, "Silicides for Interconnection Technology," *Solid State Technology*, (Jan. 1981), pp. 65–72.

*Primary Examiner*—J. Carroll
*Attorney, Agent, or Firm*—Hill, Van Santen, Steadman & Simpson

[57] ABSTRACT

An integrated circuit in complementary circuit technology comprising a substrate bias voltage generator which applies a negative (positive) substrate bias voltage to the p(n) substrate in which n(p) tubs are inserted. The source regions of the n(p)-channel FETs arranged in the substrate lie at ground potential. In order to avoid "latch-up" effects, an output of the substrate bias voltage generator is connected via a Schottky diode to a circuit point that lies at ground potential.

6 Claims, 2 Drawing Sheets

INTEGRATED CIRCUIT IN COMPLEMENTARY CIRCUIT TECHNOLOGY COMPRISING A SUBSTRATE BIAS VOLTAGE GENERATOR AND A SCHOTTKY DIODE

BACKGROUND OF THE INVENTION

The invention relates to an integrated circuit in complementary circuit technology comprising a substrate bias voltage generator which generates a negative substrate bias voltage connected to a semconductor substrate within which the complementary circuit technology is integrated.

In circuits of this type, the semiconductor substrate does not lie at the ground potential $V_{SS}$ of the circuit, but at a substrate bias voltage $V_{BB}$ which is generatetd by means of a substrate bias voltage generator. Given a semiconductor substate of p-conductive material that is provided with an inserted, n-conductive tub-shaped semiconductor zone, a negative substrate bias voltage of about $-2$ to $-3$ volts is employed. The source regions of field effect transistors which are provided on the semiconductor substrate outside of the tub-shaped semiconductor zone are placed at the ground potential $V_{SS}$.

At the moment the supply voltage $V_{DD}$ is switched on, the p-conductive semiconductor substrate under consideration is first in a "floating" state in which it is disconnected from external potentials. Via the depletion layer capacitances which are present, the substrate can be temporarily charged to a positive bias voltage which remains until the substrate bias voltage generator takes effect and is replaced by the negative substrate bias voltage gradually building up at the output of the generator.

These depletion layer capacitances lie, first, between the tub-shaped semiconductor zone and the substrate and, second, between the source regions lying on the ground potential and the substrate. During operation of the integrated circuit as well, however, greater currents which are diverted from the semiconductor substrate via the substrate bias voltage generator to a terminal lying at ground potential can also lead to a positive bias voltage of the semiconductor substrate due to the voltage drop at the internal resistor of the substrate bias voltage generator. Positive bias voltages, however, represent a high safety risk for the integrated circuit, since a "latch-up" effect which generally means the outage of the integrated circuit can be triggered.

For an understanding of the "latch-up" effect, it can be assumed that four successive semiconductor layers of alternating conductivity type are generally provided between a terminal of a field effect transistor of the first channel type lying in the tub-shaped semiconductor zone and a terminal of a field effect transistor of the second channel type placed on the semiconductor substrate outside of this zone. The one connecting region of the former transistor forms the first semiconductor layer, the tub-shaped semiconductor zone forms the second layer, the semiconductor substrate forms the third layer, and the one connecting region of the latter transistor forms the fourth semiconductor layer. Given a positive bias voltage of the semiconductor substrate, the pn-junction between the third and the fourth semiconductor layers can be biased to such a degree in a conducting direction that a current path arises between the transistor terminals, this current path being attributed to a parasitic thyristor effect within this four-layer structure. Even after the positive bias voltage disappears, the current path remains in existence and can thermally overload the integrated circuit.

SUMMARY OF THE INVENTION

An object of the invention is to specify a circuit of the type initially cited wherein the appearance of "latch-up" effects is largely avoided. This is achieved in accordance with the invention by inserting an n-conductive semiconductive region into the semiconductor substrate and which is provided with a metal contact which forms a Schottky diode together with the n-conductive semiconductor region. The metal contact is connected to the output of the substrate bias voltage generator. The semiconductor region is connected to ground potential.

The advantage obtainable with the invention is that a bias voltage of an undesired polarity which is at the semiconductor substrate and which can trigger a "latch-up" effect is limited with simple means to a value which makes this danger impossible.

DESCRIPTION OF THE PREFERRED EMBODIMENTS

Figure 1:
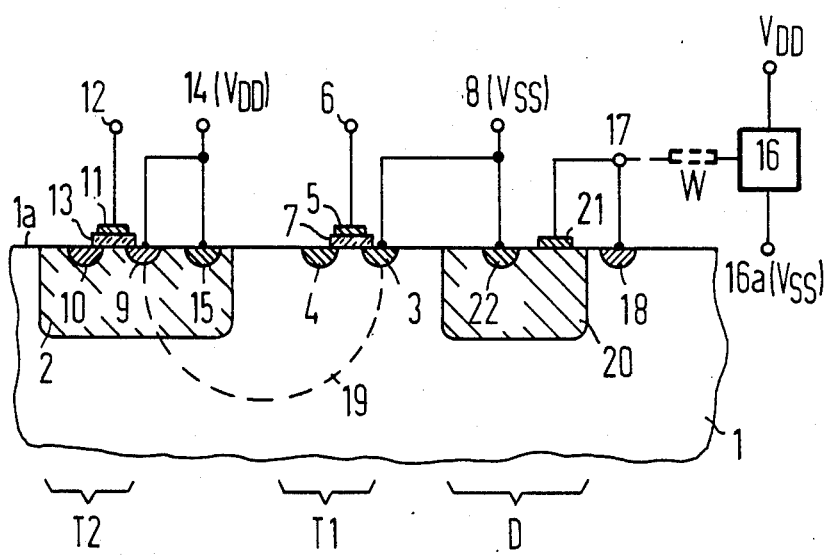
FIG. 1 illustrates an integrated circuit of the invention for the prevention of "latch-up"

As shown in the drawing FIG. 1, an integrated circuit of the invention is constructed on a semiconductor substrate 1 of doped semiconductor material, for example p-conductive silicon. The substrate 1 has an n-conductive, tub-shaped semiconductor zone 2 which extends up to the boundary surface 1a of the substrate 1. n+doped semiconductor regions 3 and 4 which form the source and drain region of an n-channel field effect transistor T1 are inserted into the substrate 1 outside of the semiconductor zone 2. The channel region lying between regions 3 and 4 is covered by a gate 5 provided with a terminal 6, and is separted from the boundary surface 1a by a thin, electrically insulating layer 7 of, for example, SiO$_2$. The source region 3 is connected to a terminal 8 which lies at a ground or reference potential $V_{SS}$. p+doped regions 9 and 10, which represent the source and drain region of a p-channel field effect transistor T2, are also inserted into the semiconductor zone 2. The channel region lying between the regions 9 and 10 is covered by a gate 11 provided with a terminal 12, and is separated from the boundary surface 1a by a thin, electrially insulating layer 13 of, for example, SiO$_2$. The source region 9 of T2 is connected to a terminal 14 wired with a supply voltage $V_{DD}$. The semiconductor zaone 2 lies at the supply voltage $V_{DD}$ via an n+doped contact region 15 connected to the terminal 14.

A substrate bias voltage generator 16 is also provided, this generating a negative substrate bias voltage of, for example, $-2$ to $-3$ volts. The output 17 of the substrate bias voltage generator is connected to a p+doped contact region 18 that is inserted into the semiconductor substrate 1. The semiconductor substrate 1 is at the negative substrate bias voltage generated by 16, whereas the source regions, for example 3, of the transistors, for example T1 situated in the semiconductor substrate 1, are at ground potential $V_{SS}$. Among the things thus achieved is that the depletion layer capacitances of the source regions of the transistors arranged in the substrate 1 are diminished.

In order to avoid a "latch-up" effect that could occur within the four-layer structure 3, 1, 2, and 9 lying along the dotted line 19 between the terminals 8 and 14, the output 17 of the subtrate bias voltage generator 16 is connected via a Schottky diode D to a circuit point that is at ground potential. In the illustrated exemplary embodiment, this circuit point corresponds to the terminal 8. An n-conductive semiconductor region 20 that is inserted into the semiconductor substrate 1, extends up to the boundary surface 1a and has a doping concentration of about $10^{16}$ cm$^{-3}$. It is with a metal contact 21 which represents a Schottky diode together with the semiconductor region 20. The metal contact 21 is preferably formed of the silicide of a refractory metal, particularly of tantalum silicide (TaSi$_2$). Other materials which are employed in a known way for Schottky diodes such as, for example, platinum or molybdenum, also come into consideration. Furthermore, the metal contact 21 can also be formed of aluminum or of a double layer which comprises a first sub-layer of the silicide of a refractory metal and a second sub-layer of aluminum or AlSi which lies above the first sub-layer. The metal contact 21 is connected to the output 17 of the substrate bias voltage generator 16. The semiconductor region 20 is connected to the terminal 8 via an n+doped contact region 22.

The forward threshold voltage of the Schottky diode D amounts to about 0.2 V. It is thus lower than the forward threshold voltage of the pn-junctions between the source regions 3 of the n-channel transistors, for example T1, and the semiconductor substrate 1. When the semiconductor substrate lies at a positive bias voltage that exceeds the forward threshold voltage of the Schottky diode D, then the latter is conductive. This means that the positive bias voltage of the semiconductor substrate 1 is limited to the forward threshold voltage of D. This thus prevents the bias voltage of 1 from rising to such a value that it reaches or exceeds the forward threshold voltage of the pn-junctions between the source regions of the n-channel transistors, for example T1, and the substrate 1, and which could lead to a "latch-up" effect.

The clamp effect of the Schottky diode occurs, for example, when due to the connection of the supply voltage V$_{DD}$, the semiconductor substrate 1 is boosted to a positive bias voltage by the capacitive voltage division between the terminals 14 and 8, as long as the generator 16 does not yet supply the full negative bias voltage. Only when the negative bias voltage subsequently begins to build up at the output 17 does the Schottky diode inhibit when the bias voltage falls below its threshold voltage, so that the described clamp effect is suppressed. When high currents arise during operation, and which flow via the semiconductor substrate 1 and the parts 18, 17, and 16 to the terminal 16a which lies at ground potential V$_{SS}$, then a voltage drop can occur at the internal resistor W of 16 such that the output 17, and thus the semiconductor substrate 1, at least temporarily arrives at a positive bias voltage. In this case, too, D becomes conductive when the forward threshold voltage is exceeded, so that the voltage at 17 is again limited to the forward threshold voltage of D. This clamp effect is suppressed as soon as a negative bias voltage begins to establish itself at the substrate 1 and the bias voltage falls below the forward threshold voltage of the diode D.

The substrate bias voltage generator 16 is preferably cointegrated on the semicoductor substrate 1.

Figure 2:
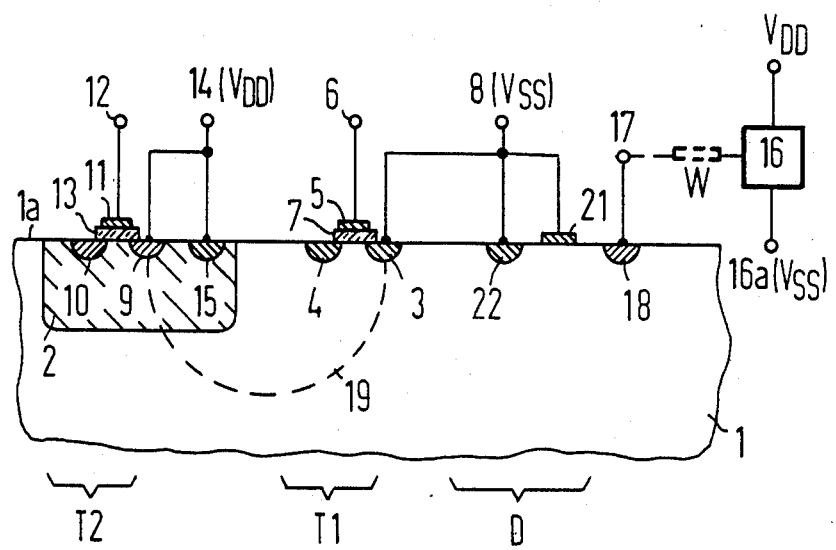
FIG. 2 illustrates an alternate embodiment of the invention.

In addition to the embodiments set forth up to now, the invention also embraces those structures as shown in FIG. 2 wherein n-conductive substrates are provided with p-conductive, tub-shaped semiconductor zones. The conductivity types of all semiconductor parts and the polarities of all voltages are respectively replaced by those conductivity types and polarities of the opposite sign. The semiconductor region 20 is thus eliminated, so that the metal contact 21 directly contacts the n-conductive substrate 1 in this case. Thus, it is not connected to the output 17 of the substrate bias voltage generator 16, but to the circuit point 8 lying at V$_{SS}$.

A preferred application of the invention results for periphery circuits of high-packing-density dynamic semiconductor memories which are monolithically integrated with the memory cells.

Although various minor changes and modifications might be proposed by those skilled in the art, it will be understood that we wish to include within the claims of the patent warranted hereon all such changes and modifications as reasonably come within our contribution to the art.

We claim as our invention:

1. An integrated circuit in complementary circuit technology, comprising:
    field effect transistors of different channel types and wherein at least a first field effect transistor thereof is arranged in a p-conductive semiconductor substrate and at least a second field effect transistor thereof is arranged in an n-conductive, semiconductor zone provided in said semiconductor substrate;
    said semiconductor zone being connected to a supply voltage;
    one region of said first field effect transistor being connected to a reference potential;
    said semiconductor substrate being connected to an output of a substrate bias voltage generator for generating a negative substrate bias voltage and to which said reference potential and said supply voltage are supplied;
    an n-conductive semiconductor region inserted into said semiconductor substrate and which is provided with a metal contact which forms a Schottky diode together with said n-conductive semiconductor region;
    said metal contact being connected to said output of said substrate bias voltage generator; and
    said semiconductor region being connected to said reference potential.

2. An integrated circuit according to claim 1 wherein said metal contact is formed of a silicide of a refractory metal.

3. An integrated circuit according to claim 2 wherein the silicide of the refractory metal comprises tantalum silicide.

4. An integrated circuit in complementary circuit technology, comprising:
    field effect transistors of different channel types and wherein at least a first field effect transistor thereof is arranged in an n-conductive semiconductor substrate and at least a second field effect transistor thereof is arranged in a p-conductive semiconductor zone provided in said substrate;
    said semiconductor zone being connected to a supply voltage;

one region of said first field effect transistor being connected with a reference potential;

said semiconductor substrate being connected to an output of a substrate bias voltage generator for generating a substrate bias voltage and to which said reference potential and said supply voltage are provided;

said semiconductor substrate being provided with a metal contact which forms a Schottky diode with said semiconductor substrate; and said metal contact being connected to said reference potential.

5. An integrated circuit according to claim 4 wherein said metal contact is formed of a silicide of a refractory metal.

6. An integrated circuit according to claim 5 wherein said silicide of a refractory metal comprises tantalum silicide.

* * * * *